United States Patent
Robbins

(10) Patent No.: US 9,678,159 B2
(45) Date of Patent: Jun. 13, 2017

(54) COMMUNICATION AND CONTROL TOPOLOGY FOR EFFICIENT TESTING OF SETS OF DEVICES

(71) Applicant: Cavium, Inc., San Jose, CA (US)

(72) Inventor: Ethan Frederick Robbins, North Grafton, MA (US)

(73) Assignee: CAVIUM, INC., San Jose, CA (US)

( * ) Notice: Subject to any disclaimer, the term of this patent is extended or adjusted under 35 U.S.C. 154(b) by 183 days.

(21) Appl. No.: 14/637,533

(22) Filed: Mar. 4, 2015

(65) Prior Publication Data

US 2016/0259000 A1    Sep. 8, 2016

(51) Int. Cl.
| | | |
|---|---|---|
| G01R 31/3185 | (2006.01) | |
| G01R 31/3177 | (2006.01) | |
| G01R 31/3187 | (2006.01) | |
| G06F 13/40 | (2006.01) | |
| G01R 31/317 | (2006.01) | |
| G11C 29/16 | (2006.01) | |
| G11C 29/42 | (2006.01) | |
| G11C 29/04 | (2006.01) | |

(52) U.S. Cl.
CPC . *G01R 31/318555* (2013.01); *G01R 31/3177* (2013.01); *G01R 31/3187* (2013.01); *G01R 31/31724* (2013.01); *G01R 31/318533* (2013.01); *G01R 31/318538* (2013.01); *G01R 31/318583* (2013.01); *G06F 13/4022* (2013.01); *G11C 29/16* (2013.01); *G11C 29/42* (2013.01); *G11C 2029/0401* (2013.01)

(58) Field of Classification Search
CPC ...... G01R 31/318555; G01R 31/31724; G01R 31/3177; G01R 31/318533; G01R 31/318538; G01R 31/318583; G01R 31/3187; G11C 29/42; G11C 29/16; G11C 2029/0401; G06F 13/4022
USPC ......................................... 714/726, 729, 718
See application file for complete search history.

(56) References Cited

U.S. PATENT DOCUMENTS

| | | |
|---|---|---|
| 5,689,466 A | 11/1997 | Qureshi |
| 5,961,653 A | 10/1999 | Kalter et al. |
| 5,995,731 A | 11/1999 | Crouch et al. |

(Continued)

OTHER PUBLICATIONS

Huang et al. "A Programmable BIST Core for Embedded DRAM", IEEE p. 59-69, 1999.

(Continued)

*Primary Examiner* — John J Tabone, Jr.
(74) *Attorney, Agent, or Firm* — Occhiuti & Rohlicek LLP

(57) ABSTRACT

A master controller includes: an interface to a CPU, an input port configured to receive a digital signal, and an output port configured to transmit a digital signal. Slave controllers each include: an interface to a device, an input port configured to receive a digital signal, and an output port configured to transmit a digital signal. A first chain bridge includes: a first set of input and output ports that couple the first chain bridge to a first chain of nodes each coupled to neighboring nodes by conductor paths in a closed loop, where the nodes of the first chain include the master controller, and a second set of input and output ports that couple the first chain bridge to a second chain of nodes each coupled to neighboring nodes by conductor paths in a closed loop, where the nodes of the second chain include multiple slave controllers.

36 Claims, 3 Drawing Sheets

(56) References Cited

U.S. PATENT DOCUMENTS

| | | | |
|---|---|---|---|
| 6,415,403 B1 | 7/2002 | Huang et al. | |
| 6,452,904 B1 * | 9/2002 | Lemieux | H04W 24/00 370/236 |
| 6,654,831 B1 * | 11/2003 | Otterness | G06F 3/0613 710/74 |
| 6,691,264 B2 | 2/2004 | Huang | |
| 6,779,140 B2 * | 8/2004 | Krech, Jr. | G11C 29/56 713/375 |
| 7,240,267 B2 | 7/2007 | Jayabharathi | |
| 7,308,621 B2 | 12/2007 | Adams et al. | |
| 7,631,236 B2 | 12/2009 | Gorman et al. | |
| 7,737,725 B1 * | 6/2010 | Ansari | G06F 15/7867 326/41 |
| 8,386,864 B2 | 2/2013 | Dubey et al. | |
| 9,024,650 B2 * | 5/2015 | Somachudan | G01R 31/31724 324/750.3 |
| 2006/0092858 A1 * | 5/2006 | Kynast | H04L 12/403 370/254 |
| 2006/0114943 A1 * | 6/2006 | Kynast | H04L 12/422 370/509 |
| 2006/0245454 A1 * | 11/2006 | Balasubramanian | H04L 12/4625 370/509 |
| 2008/0259784 A1 * | 10/2008 | Allan | H04L 45/02 370/216 |
| 2009/0063786 A1 * | 3/2009 | Oh | G06F 11/1068 711/148 |
| 2011/0264971 A1 * | 10/2011 | Bahl | G01R 31/31859 714/731 |
| 2014/0059440 A1 * | 2/2014 | Sasaki | H04L 41/145 715/735 |
| 2014/0075320 A1 * | 3/2014 | Sasaki | H04L 12/40 715/736 |
| 2014/0132291 A1 * | 5/2014 | Somachudan | G01R 31/3187 324/750.3 |
| 2015/0137958 A1 * | 5/2015 | Norlen | G08C 17/02 340/12.5 |
| 2015/0293871 A1 * | 10/2015 | Rahamim | H04L 12/437 710/106 |
| 2015/0319081 A1 * | 11/2015 | Kasturi | H04L 49/355 709/239 |
| 2015/0358235 A1 * | 12/2015 | Zhang | H04L 45/745 370/230 |
| 2016/0183351 A1 * | 6/2016 | Snyder | H05B 37/0245 315/152 |
| 2016/0219679 A1 * | 7/2016 | Snyder | H05B 37/0254 |

OTHER PUBLICATIONS

Built-in Self-Test (BIST) Using Boundary Scan, Copyright—1996, Texas Instruments Incoporated.

* cited by examiner

COMMUNICATION AND CONTROL TOPOLOGY FOR EFFICIENT TESTING OF SETS OF DEVICES

BACKGROUND

The invention relates to communication and control topology for efficient testing of sets of devices.

Digital circuitry implemented in an integrated circuit can be complex, and may include specialized circuitry that supports testing of various devices on the fabricated chip. For example, a system-on-a-chip (SoC) may include a central processing unit (CPU), which may be a multi-core processor with multiple processor cores, in addition to various digital or analog devices that provide a variety of functionality used by, or operating alongside, the CPU. One type of circuitry that facilitates testing of devices is based on built-in self-test (BIST) and built-in self-repair (BISR) techniques. One way to provide access to signals propagating to or from circuitry being tested by such techniques is to use a "scan chain" (also called a "serial shift chain") that uses a closed loop of nodes coupled to different devices. The nodes serially receive and forward information around the loop during a testing procedure. A standard known as "JTAG" (Joint Test Action Group) or more formally "1149.1 IEEE Standard for Test Access Port and Boundary-Scan Architecture," has been used for testing printed circuit boards (PCBs) and integrated circuits (ICs). Typically, there are multiple boundary scan cells, each connected to a portion of the circuitry being tested. A chain of cells is formed with a cell being connected to two neighboring cells over a point-to-point multi-wire bus. This chain may be located at the boundary of a PCB or IC with cells also being connected to input/output (I/O) pins. Test information can be sent around the chain to test any device in the system from a single standardized interface.

SUMMARY

In one aspect, in general, an apparatus for testing devices coupled to respective slave controllers includes at least one master controller, the master controller including: an interface to a central processing unit, an input port configured to receive a digital signal from a conductor path, and an output port configured to transmit a digital signal to a conductor path. The apparatus includes a plurality of slave controllers, each slave controller including: an interface to a device, an input port configured to receive a digital signal from a conductor path, and an output port configured to transmit a digital signal to a conductor path. The apparatus includes a first chain bridge that includes: a first set of input and output ports that couple the first chain bridge to a first chain of nodes each coupled to neighboring nodes by conductor paths in a closed loop, where the nodes of the first chain include the master controller, and a second set of input and output ports that couple the first chain bridge to a second chain of nodes each coupled to neighboring nodes by conductor paths in a closed loop, where the nodes of the second chain include a plurality of slave controllers.

Aspects can include one or more of the following features.

The apparatus further includes a hierarchy of chains that includes: the first chain at a root level of the hierarchy, the second chain at a first intermediate level below the root level, the nodes of the second chain including at least the first chain bridge coupling the second chain to the first chain, and a second chain bridge coupling the second chain to a third chain of nodes at a level below the first intermediate level, and at one or more levels of the hierarchy below the first intermediate level, multiple chains of nodes each coupled to neighboring nodes by conductor paths in a closed loop, where the nodes of each chain of the multiple chains include one or more slave controllers and at least one chain bridge.

At least two different chains of nodes include slave controllers that include interfaces to devices in different clock domains of an integrated circuit.

At least two different chains of nodes include slave controllers that include interfaces to devices in different power domains of an integrated circuit.

Each slave controller includes: a clock input port; circuitry that receives a digital signal over an input port according to edges of clock signal provided at the clock input port; and circuitry that transmits a digital signal over an output port according to edges of a clock signal provided at the clock input port.

The apparatus further includes a first clock circuit providing a first clock signal to each slave controller in the second chain.

The apparatus further includes a second clock circuit providing a second clock signal to each slave controller in a third chain of nodes, wherein the second clock signal has at least one of a different frequency or phase than the first clock signal.

A chain bridge coupled to both the second chain and the third chain includes circuitry that translates messages between digital signals with aligned to the first clock signal and digital signals with edges aligned to the second clock signal.

The master controller is configured to provide poll messages that circulate around a chain, and the slave controllers are configured to provide poll response messages that circulate around a chain in response to a poll message after detecting an idle signal after the poll message.

The slave controllers are configured to circulate messages around a chain that correspond to status or control of a device coupled to its interface.

The master controller comprises a master memory controller, the slave controllers comprise slave memory controllers, and the devices comprise memory devices.

The messages include one or more of: a built-in self-test message, a built-in self-repair message, or an error-correcting code message.

In another aspect, in general, a non-transitory machine-readable medium stores a program for testing devices coupled to respective slave controllers. The program includes instructions for causing a machine to simulate at least one master controller, the master controller including: an interface to a central processing unit, an input port configured to receive a digital signal from a conductor path, and an output port configured to transmit a digital signal to a conductor path. The program includes instructions for causing a machine to simulate a plurality of slave controllers, each slave controller including: an interface to a device, an input port configured to receive a digital signal from a conductor path, and an output port configured to transmit a digital signal to a conductor path. The program includes instructions for causing a machine to simulate a first chain bridge that includes: a first set of input and output ports that couple the first chain bridge to a first chain of nodes each coupled to neighboring nodes by conductor paths in a closed loop, where the nodes of the first chain include the master controller, and a second set of input and output ports that couple the first chain bridge to a second chain of nodes each coupled to neighboring nodes by conductor paths in a closed loop, where the nodes of the second chain include a plurality of slave controllers.

Aspects can include one or more of the following features.

The medium further includes instructions for causing the machine to simulate a hierarchy of chains that includes: the first chain at a root level of the hierarchy, the second chain at a first intermediate level below the root level, the nodes of the second chain including at least the first chain bridge coupling the second chain to the first chain, and a second chain bridge coupling the second chain to a third chain of nodes at a level below the first intermediate level, and at one or more levels of the hierarchy below the first intermediate level, multiple chains of nodes each coupled to neighboring nodes by conductor paths in a closed loop, where the nodes of each chain of the multiple chains include one or more slave controllers and at least one chain bridge.

At least two different chains of nodes include slave controllers that include interfaces to devices in different clock domains of an integrated circuit.

At least two different chains of nodes include slave controllers that include interfaces to devices in different power domains of an integrated circuit.

Each slave controller includes: a clock input port; circuitry that receives a digital signal over an input port according to edges of clock signal provided at the clock input port; and circuitry that transmits a digital signal over an output port according to edges of a clock signal provided at the clock input port.

The medium further includes instructions for causing the machine to simulate a first clock circuit providing a first clock signal to each slave controller in the second chain.

The medium further includes instructions for causing the machine to simulate a second clock circuit providing a second clock signal to each slave controller in a third chain of nodes, wherein the second clock signal has at least one of a different frequency or phase than the first clock signal.

A chain bridge coupled to both the second chain and the third chain includes circuitry that translates messages between digital signals with aligned to the first clock signal and digital signals with edges aligned to the second clock signal.

The master controller is configured to provide poll messages that circulate around a chain, and the slave controllers are configured to provide poll response messages that circulate around a chain in response to a poll message after detecting an idle signal after the poll message.

The slave controllers are configured to circulate messages around a chain that correspond to status or control of a device coupled to its interface.

The master controller comprises a master memory controller, the slave controllers comprise slave memory controllers, and the devices comprise memory devices.

The messages include one or more of: a built-in self-test message, a built-in self-repair message, or an error-correcting code message.

In another aspect, in general, a method for testing design or fabrication of an integrated circuit that includes slave controllers for coupling to respective devices includes executing instructions corresponding to at least one master controller, the master controller including: an interface to a central processing unit, an input port configured to receive a digital signal from a conductor path, and an output port configured to transmit a digital signal to a conductor path. The method includes executing instructions corresponding to a plurality of slave controllers, each slave controller including: an interface to a device, an input port configured to receive a digital signal from a conductor path, and an output port configured to transmit a digital signal to a conductor path. The method includes executing instructions corresponding to a first chain bridge that includes: a first set of input and output ports that couple the first chain bridge to a first chain of nodes each coupled to neighboring nodes by conductor paths in a closed loop, where the nodes of the first chain include the master controller, and a second set of input and output ports that couple the first chain bridge to a second chain of nodes each coupled to neighboring nodes by conductor paths in a closed loop, where the nodes of the second chain include a plurality of slave controllers.

Aspects can include one or more of the following features.

The method further includes executing instructions corresponding to a hierarchy of chains that includes: the first chain at a root level of the hierarchy, the second chain at a first intermediate level below the root level, the nodes of the second chain including at least the first chain bridge coupling the second chain to the first chain, and a second chain bridge coupling the second chain to a third chain of nodes at a level below the first intermediate level, and at one or more levels of the hierarchy below the first intermediate level, multiple chains of nodes each coupled to neighboring nodes by conductor paths in a closed loop, where the nodes of each chain of the multiple chains include one or more slave controllers and at least one chain bridge.

At least two different chains of nodes include slave controllers that include interfaces to devices in different clock domains of an integrated circuit.

At least two different chains of nodes include slave controllers that include interfaces to devices in different power domains of an integrated circuit.

Each slave controller includes: a clock input port; circuitry that receives a digital signal over an input port according to edges of clock signal provided at the clock input port; and circuitry that transmits a digital signal over an output port according to edges of a clock signal provided at the clock input port.

The method further includes executing instructions corresponding to a first clock circuit providing a first clock signal to each slave controller in the second chain.

The method further includes executing instructions corresponding to a second clock circuit providing a second clock signal to each slave controller in a third chain of nodes, wherein the second clock signal has at least one of a different frequency or phase than the first clock signal.

A chain bridge coupled to both the second chain and the third chain includes circuitry that translates messages between digital signals with aligned to the first clock signal and digital signals with edges aligned to the second clock signal.

The master controller is configured to provide poll messages that circulate around a chain, and the slave controllers are configured to provide poll response messages that circulate around a chain in response to a poll message after detecting an idle signal after the poll message.

The slave controllers are configured to circulate messages around a chain that correspond to status or control of a device coupled to its interface.

The master controller comprises a master memory controller, the slave controllers comprise slave memory controllers, and the devices comprise memory devices.

The messages include one or more of: a built-in self-test message, a built-in self-repair message, or an error-correcting code message.

Aspects can have one or more of the following advantages.

One example of a type of device that may include BIST/BISR circuitry or other testing and repair circuitry in an integrated circuit is an embedded random access memory (RAM), such as embedded dynamic RAM (eDRAM). In integrated circuits such as SoCs that have a large number of embedded RAM devices, it may be impractical to include all such devices on a single communication chain. For example, there may be different portions of an IC that have different characteristics that would cause difficulties for operating a single communication chain. One portion may be in one clock domain that is fed by a first clock signal, and another portion may be in another clock domain that is fed by a second clock signal having a different frequency than the first clock signal. Or, some portions may be located in a "power island" that could potentially be powered down during operation causing all devices in that portion to stop operating. Embedded RAM devices may be located in any of these portions of the IC, making it difficult to operate a single communication chain that can consistently communicate test information to and from the devices (e.g., test information for detecting and reporting bit errors using BIST circuitry in each RAM device).

Using the techniques described herein, a "hierarchical communication chain" can be used to provide a centralized, low overhead mechanism for detecting and reporting bit errors in systems containing very large numbers of embedded RAM devices. A slave memory controller coupled to each RAM device is able to provide a consistent testing interface that encapsulates each embedded RAM device, including any testing and repair circuitry built into the device or associated with the device. A central master memory controller is then able to collect and report errors using multiple communication chains arranged into a hierarchical structure, as described in more detail below. The master memory controller would periodically provide testing information from the embedded RAMs in the system and report any failures to a CPU (e.g., using an interrupt or some other event). The hierarchical arrangement reduces the logic and routing needed to implement the error reporting function, provides a consistent software interface for a variety of IC designs, and may significantly simplify verification of the IC. Additionally, there is a consistent hardware interface that facilitates error-free extension of an IC design across different generations and implementations by decoupling the topology associated with communication of commands from the specific types of commands (e.g., commands associated with testing memory devices or commands associated with any other type of devices within the IC).

Other features and advantages of the invention will become apparent from the following description, and from the claims.

DESCRIPTION

Figure 1:
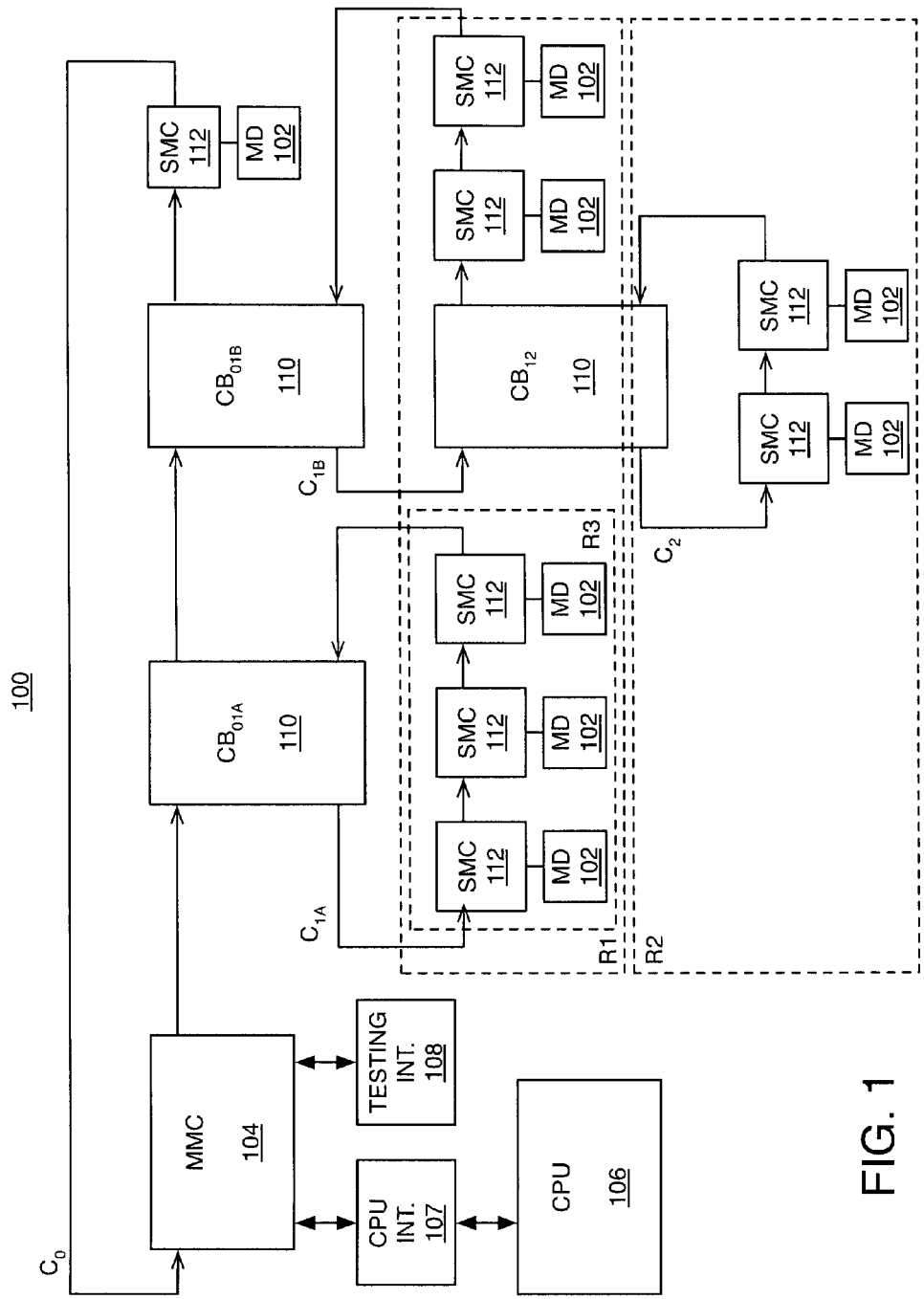
FIG. 1 is a schematic diagram of a hierarchical communication chain.

During the design and manufacture of an integrated circuit, there are various stages in which different types of testing (also called "verification") is performed. During design stages the integrate circuit is implemented as a simulation that is specified at any of a variety of levels of abstraction. A high level functional description (e.g., in a high level programming language) may be use to model functional aspects of modules including computational functions performed by the module and communication protocols used to communicate with other modules. At other levels, descriptions include a register transfer level (RTL) description that models digital signals flowing among clocked registers (e.g., flip-flops) and combinational logic, and a gate level description that models low-level circuitry of the integrated circuit. Testing may be iterated over the various stages. A fabricated Silicon die (or "chip") that embodies the integrated circuit may also be tested, both before and after packaging the chip into a packaged die.

The hierarchical communication chain described herein is able to facilitate testing of the fabricated Silicon chip in "post-silicon" stages, as well as testing of the design of the simulated chip in both low level "pre-silicon" stages and in higher level design stages. In design testing stages, designers can perform early prototyping by allocating memory devices and forming communication chains that are coupled in a hierarchical manner, as needed. During the design process, the changes to the chains can be made with minimal impact on later testing stages. During pre-silicon testing, the testing procedures will have a consistent interface to the simulated testing and repair circuitry of the memory devices. The simulation environment can extract properties from each memory that can be used to generate rules and tests for interacting with the testing and repair circuitry of each memory device. In early post-silicon stages, the consistent interface provided by the hierarchical communication chain can be used for testing for manufacturing errors (e.g., using BIST/BISR). In testing of software for the chip (e.g., drivers or software development kits), the consistent interface provided by the hierarchical communication chain can be used for accessing error correcting code (ECC) circuitry of the embedded memory devices.

As various kinds of integrated circuits (e.g., SoCs) become more and more advanced, the amount of memory on chip has increased. Also as the fabrication technologies enable smaller devices on the chip, defects become more of a problem. Techniques such as use of BIST, BISR, and/or ECC circuitry may be used to add redundancies to memory cells, allowing for a small number of defects in production parts. With these strategies there is management and monitoring overhead that goes along with them. For example, each memory device may include circuitry for reporting results from BIST, accepting BISR repair solutions, and reporting ECC errors to management software. With hundreds of individual memories, designing these capabilities into a SoC can be time consuming and error prone. Also, as a SoC gets more complex the pre-silicon and post-silicon testing and verification may also get more time consuming and error prone. By modeling individual memory devices and their respective testing and repair circuitry as individual modules for high-level pre-silicon verification, using the interface provided by the respective slave memory controllers as a "wrapper" around each module, a large number of memory devices (potentially hundreds) can be arranged in a hierarchical communication chain that provides a simpler and more consistent interface to the distributed memories. This manner of designing for verification can allow the verification part of the design process to be more automated.

FIG. 1 shows an example of a hierarchical communication chain 100 for managing testing of sets of devices within different domains of an integrated circuit. In this example, the devices being tested are memory devices (MD) 102, such as embedded RAM devices or any type of memory device such as flip-flop arrays, content addressable memories (CAMs), or read-only memories (ROMs). A master memory controller (MMC) 104 is coupled to a CPU 106 via a CPU interface 107. The CPU interface 107 is able to connect to a CPU bus or input or output ports of the CPU 106, such as an interrupt input port for receiving an interrupt signal. The CPU 106 will able to interact with the MMC 104 according to the instructions of any software that is executing on the CPU 106 during operation. The MMC 104 is also coupled to a testing interface 108, which may include circuitry for implementing any of a variety interface protocols. The MMC 104 includes input and output ports that couple the MMC 104 to a root level communication chain $C_0$ that includes at least one chain bridge (CB) 110 and any number of other nodes that together form a unidirectional communication path. Each communication chain also has nodes corresponding to a number of slave memory controllers (SMCs) 112, each coupled to a respective memory device 102. In this example, there are a relatively small number of each type of device, for simplicity of the illustration, however in an actual integrated circuit there could tens or hundreds of chains and/or devices. Generally, there need not be any practical limit as to the number of chains and/or devices as the manufacturing process allows devices to shrink in size or chips increase in size and/or device count and complexity.

The chain bridges 110 enable the hierarchical communication chain 100 to be formed by coupling different communication chains at different levels of a hierarchy. Each chain bridge 110 includes logic to arbitrate between two communication chains (e.g., to make sure the chain bridge 110 is not forwarding from both communication chains at the same time). Some chain bridges 110 may be configured differently from other chain bridges. For example, some chain bridges 110 include circuitry to handle a possible clock domain crossing, and manage isolation of a child chain from its parent chain, as described in more detail below. Hierarchical communication chains can be configured and arranged to address a variety of performance attributes. For example, hierarchical communication chains can be split to reduce access latency.

By selectively connecting chain bridges 110 to couple pairs of communication chains, the MMC 104 in the root level communication chain $C_0$ is able to serve as a single point of control for all memory devices 102 in the integrated circuit. In the example of FIG. 1, there are two communication chains at a level below the root level: a communication chain $C_{1A}$ coupled to the communication chain $C_0$ by a chain bridge $CB_{01A}$; and a communication chain $C_{1B}$ coupled to the communication chain $C_0$ by a chain bridge $CB_{01B}$. There is also one communication chain $C_2$, two levels below the root level, coupled to the communication chain $C_{1B}$ by a chain bridge $CB_{12}$. In this example the hierarchy of the hierarchical communication chain 100 has a tree topology, such that there is one root level chain, and each lower level communication chain is coupled to a single "parent chain" by a chain bridge. In such a tree topology, an "intermediate chain", such as communication chain $C_{1B}$, is coupled to both a parent chain and one or more "child chains", and a "leaf chain", such as communication chains $C_{1A}$ and $C_2$, is only coupled to a parent chain. While this example has only four chains, a typical integrated circuit may have tens or hundreds of chains coupled together within a hierarchical communication chain structure, enabling hundreds of memory devices to be accessed for communication of testing information up and down levels of the chain, as described in more detail below.

The hierarchical communication chain structure allows for flexibility in the selection of which regions of the integrated circuit will be served by different communication chains. In the example of FIG. 1, there is a region R1 that corresponds to a first clock domain, and a region R2 that corresponds to a second clock domain. Digital circuitry in the first clock domain is clocked by a first clock signal, and digital circuitry in the second clock domain is clocked by a second clock signal that is different from the first clock signal (e.g., having a different frequency or having a non-negligible phase offset). The chain bridge $CB_{12}$ includes circuitry that enables signals to pass between communication chains in the different clock domains, as described in more detail below. The integrated circuit also includes a region R3 (which is contained within region R1) that corresponds to a power island that is able to be powered down without interrupting operation of other circuitry outside of the power island. Thus, there is a communication chain $C_{1A}$ that is dedicated to accessing the memory devices in region R3. By dedicating separate communication chains for power islands, it is possible to arrange the hierarchical communication chain 100 to continue operation as power islands are powered up or down. In particular, as long as memory devices in a power island (or other region of the integrated circuit that may be unresponsive during operation for various reasons) are part of a leaf chain, no other communication chain in the hierarchy will be affected that power island being powered down and inactive. Otherwise, if a communication chain in a power island were an intermediate chain between higher and lower level communication chains, communication between those chains could be interrupted when the power island was powered down.

Each communication chain has a node that serves as a "chain controller" acting as both a source of commands transmitted around the chain, and a sink of response information from the nodes transmitted around the chain back to the chain controller. The MMC 104 is the chain controller for the root level chain $C_0$. The chain bridge 110 that couples a particular communication chain to its parent chain is the chain controller for that particular communication chain. The chain controller can issue commands that are transmitted node-to-node around its communication chain, and can receive responses from nodes in its communication chain, which are also transmitted node-to-node in the same direction as the commands back around to the chain controller. Most of the nodes in a typical communication chain will be SMC nodes, but an intermediate chain will also include one or more chain bridge nodes in addition to SMC nodes that serve as chain controller of a child chain. Since a chain bridge 110 coupling a parent chain to a child chain also acts as a node in the parent chain, a chain bridge 110 is able to pass commands from the chain controller of the parent chain to the child chain, and is able to pass responses from the child chain to the chain controller of the parent chain. The commands/responses sent/received by the MMC 104 of the root level chain $C_0$ can be used to communicate over the CPU interface 107 or testing interface 108 using any of a variety of standardized or custom interface protocols. For example, a standardized debugging protocol such as JTAG can be used with the testing interface 108.

Each communication chain in the hierarchy can be configured to use a common protocol for transmitting a data unit node-to-node around the communication chain. In some protocols, the data unit is transmitted one bit at a time, where each bit consists of a high value (indicating a binary "1" logic level) or a low value (indicating a binary "0" logic level) of a voltage on a point-to-point bus (e.g., a wire)

between neighboring nodes. The voltage value for a particular bit is maintained for a single cycle of a clock signal provided to each node. The protocol can use cut-through routing, where a node starts transmitting the bits of a data unit before the entire data unit has been received at that node. With each bit of a data unit traversing one hop per cycle, a data unit that originates at the chain controller may take a number of cycles equal to the number of nodes in the communication chain (potentially hundreds, or even thousands, of nodes) to traverse the chain. Optionally, a chain bridge node has an ability to take a number of cycles before passing a data unit along in certain situations. For example, the SMC node may use cut-through routing to pass a data unit along immediately (i.e., transmitting a bit on the next clock cycle after the clock cycle in which the bit is received), while a chain bridge node may buffer a data unit for a number of cycles while the message type is decoded and the chain bridge determines on which output port(s) to forward the data unit, as described in more detail below.

An example of a format for the data unit is shown below. The data unit starts with a uniquely recognizable starting symbol (i.e., a unique sequence of "0" and "1" bits, such as the 4-bit sequence "1010"). In other implementations, the starting symbol is not necessarily a fixed sequence or even a fixed-length sequence, but it still enables the data unit to be recognized. Following the starting symbol are: a fixed-length message type field, a memory identifier (e.g., an integer index value), and a payload whose length may depend on the specific command included in the data unit. The total length of a data unit may be around 30-40 bits, for example.

The following is an example of a list of possible message types (each capitalized label below corresponding to a value of the message type field comprising a unique 4-bit sequence), with a brief description of the purpose of each message type.

POLL—issued from the chain controller (both MMC 104 and chain bridge 110), requesting any SMC 112 or chain bridge 110 to respond with any pending asynchronous events (e.g., an event corresponding to an interrupt of the CPU 106). A chain bridge 110 that receives a POLL type data unit will pass along the data unit in the parent chain. Independently, a chain bridge 110 will issue POLL type data units to its child chain. Each chain controller may be configured to send POLL data units periodically, and/or when it is otherwise idle.

POLL_RSP—response provided by an SMC node or a chain bridge node. An SMC node responds if there are any asynchronous events to be sent. A chain bridge node responds if there are any POLL_RSP responses received from a lower level communication chain. If an SMC node or a chain bridge node has an event to be sent in response to a POLL data unit, it will do so in the cycle immediately following the last bit of the POLL data unit only if the bus from its upstream neighboring node is idle during that cycle (i.e., a "0" logic level instead of a "1" logic level indicating the starting symbol of another data unit). Since there is a delay of one clock cycle between receiving a bit and re-transmitting that bit using cut-through routing, even an SMC node will have enough time to sense a "0" idle bit at the end of a POLL data unit and transmit a "1" bit for a starting symbol (in place of the idle bit) at the end of that POLL data unit on the next clock cycle. So, in this example protocol, only the node nearest to the chain controller in the communication chain with a response to send is able to actually send that response for a given POLL data unit. Any other nodes with a response to send need to wait until another POLL data unit is sent. The responding node will generate a POLL_RSP with a payload that includes the asynchronous event information.

WRITE—issued from the MMC 104 to a specified SMC 112 by including the appropriate memory identifier of the memory device controlled by the SMC 112. This message type is a command to write control information into one of that memory's control and status registers (CSRs). The specific CSR to be written can be selected based on the value in the payload. For example, the CSR may correspond to ECC, BIST, or other testing functions.

READ—issued from the MMC 104 to a specified SMC 112 by including the appropriate memory identifier of the memory device controlled by the SMC 112. This message type is a command to read status information from one of that memory's CSRs. The specific CSR to be read can be selected based on the value in the payload.

READ_RSP—provided in response to a READ data unit. The specified SMC 112 will generate a READ_RSP with a payload that includes the status information.

SYNC/TEST—issued by the MMC 104 and traverses the whole hierarchical communication chain 100 to ensure that all memory devices 102 are connected to a corresponding SMC 112 in a communication chain. The chain bridges 110 can be configured such that the SYNC/TEST data units traverse the SMCs 112 of the hierarchy in a depth-first order, for example.

READ_MEM—issued by the MMC 104 to a specific SMC 112 by including the appropriate memory identifier of the memory device controlled by the SMC 112. This message type is a command to read a physical memory row from a memory device 102. The row to be read is provided in the payload.

READ_MEM_RSP—provided in response to a READ_MEM data unit. The specified SMC 112 will generate a READ_MEM_RSP with a payload that includes the value(s) stored in the memory row specified in the READ_MEM command. This type of data unit enables the testing interface 108 the ability to access to the contents of a memory device 102. Whereas, the CPU 106 may, in some implementations, have a more direct means for accessing the memory devices 102.

WRITE_MEM_ADDR—issued by the MMC 104 to a specific SMC 112 by including the appropriate memory identifier of the memory device controlled by the SMC 112. This message type is a command requesting the specified SMC 112 to write a row of its coupled memory device 102. The row to be written is provided in the payload.

WRITE_MEM_DATA—issued by the MMC 104 immediately after a corresponding WRITE_MEM_ADDR. The payload includes the data to be written to row of the memory indicated in that preceding WRITE_MEM_ADDR data unit.

Message types originating from the MMC 104 to a specific SMC 112 propagate throughout the hierarchy of the hierarchical communication chain 100, being forwarded by the chain bridges 110 as described above for the POLL data unit. Message types labeled above with a "_RSP" suffix are sent from the specified SMC 112 to the MMC 104, if necessary traversing up the hierarchy of the hierarchical communication chain 100. The specified SMC 112 determines whether it is to respond by checking the memory identifier to see if it matches the memory identifier of its coupled memory device 102. If a memory identifier doesn't match, the data unit is ignored. If it does match, that SMC 112 will send the response data unit around the communication chain as soon as it is ready.

The memory identifiers may be an index value assigned to each memory device 102 as determined by designer at design time. The index values are unique but not necessarily in order on the chain. For example, if the index is an integer, they are not necessarily sequential, and there may be gaps in the range of assigned integers. The index value may correspond to a portion of an address received from the CPU interface 107. Data units that include a message type corresponding to a command for nonexistent memory index would time out. Software being executed by the CPU 106 may be configured to detect such timeout events. For example, such a timeout event may occur for memory devices located in a power island that has been powered off.

The MMC 104 is configured to avoid flooding the hierarchical communication chain 100 with data units, and to leave room for responses (i.e., message types labeled above with a "_RSP" suffix). Due to the need for responses to propagate up the hierarchy through the chain bridges (as described in more detail below), the time needed for any response to arrive back at the MMC 104 is variable based on which SMC is specified and potentially other factors such as any changes in clock domains. The MMC 104 may be configured to allow only a single outstanding command waiting for a response (other than a POLL) at once. The timeout mechanism described above allows for recovery in the event that a specified SMC is not active. There can be multiple data units with a POLL message type outstanding as long as the spacing between the POLL data units allows for POLL_RSP data units to be inserted. When the MMC 104 is ready to send a data unit with a different message type, the MMC 104 will: stop sending POLL data units, send the other data unit, wait for the response to the command (or timeout), and then resume sending POLL data units. The MMC 104 may limit the number of outstanding POLL data units base out how many POLL_RSP data units it can handle. For example, if the MMC 104 can only send two interrupts to the CPU 106 at a time, the MMC 104 may set a limit of at most two POLL data units outstanding at a time.

Figure 2:
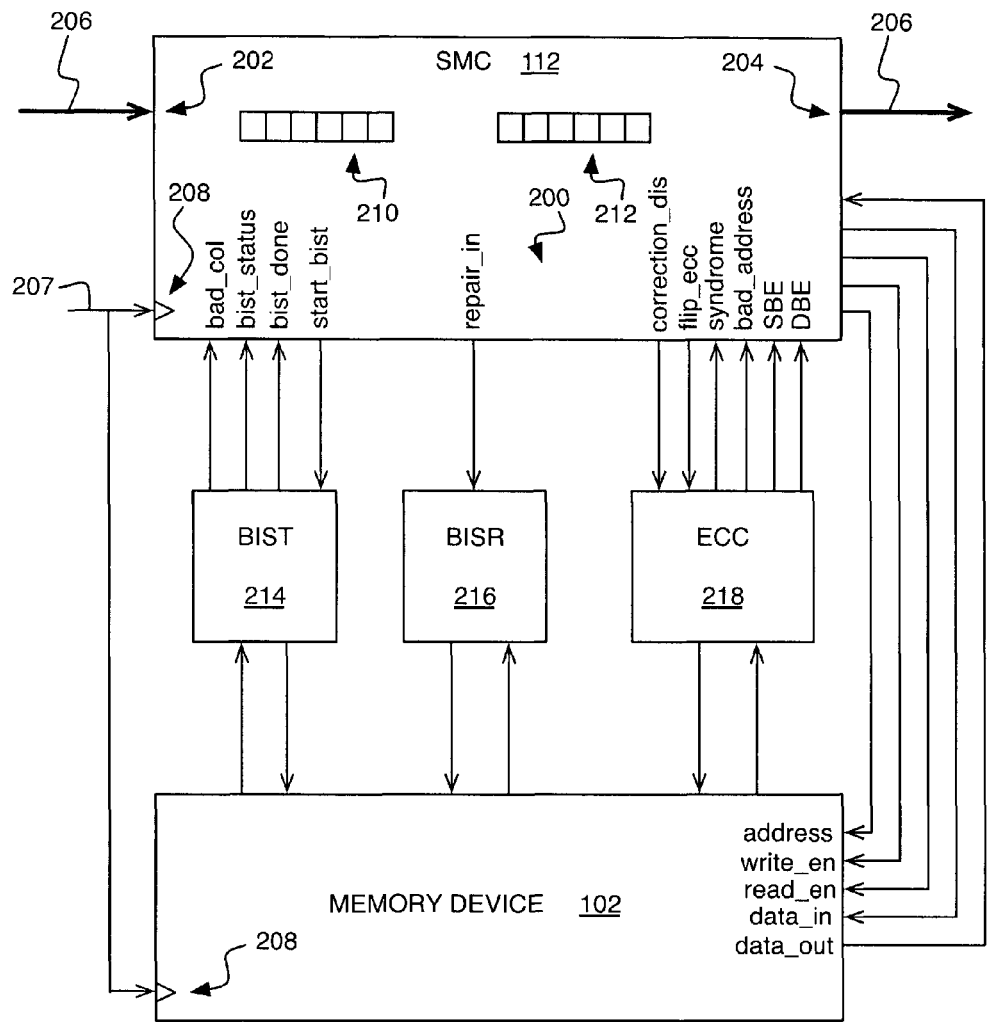
FIG. 2 is a schematic diagram of a slave memory controller coupled to a memory device.

FIG. 2 shows an example of an SMC 112 coupled to a memory device 102. The SMC 112 includes an interface 200 for connecting to the memory device 102 and any associated testing and repair circuitry, a chain input port 202 includes circuitry for receiving digital signals from an upstream neighbor, and a chain output port 204 includes circuitry for transmitting digital signals to a downstream neighbor. These ports 202, 204 connect to the neighboring nodes in the communication chain by a communication link 206 such as a point-to-point bus consisting of one or more wires (i.e., conductor paths in the integrated circuit). At least one wire is dedicated for propagating the digital signal consisting of voltages corresponding to binary logic levels for "0" or "1", with potential transitions for each bit occurring based on a clock signal 207 provided at a clock port 208. This clock signal may be the same clock signal that is provided to the memory device 102 at its clock port 209. In some implementations, instead of a strictly serial bus consisting of a single wire, the communication link 206 can include multiple wires for carrying different respective bits of the digital signal.

The SMC 112 includes a buffer 210 that stores information from data units data units received over the chain input port 202, and additional storage 212 (e.g., registers) for storing information for processing any commands associated with certain message types. The buffer 210 may be shift register, or a first-in first-out (FIFO) buffer, that stores some (not necessarily all) data units, such as those that need to be processed and/or those for which a response is needed. Some information stored in the additional storage 212 may be used for responding to the commands. Some information in the additional storage 212 may be used for configuring the memory device 102 for repair or error correction, for example. Some information in the additional storage 212 may be related to status of the memory device 102 (e.g., status about errors that may have occurred in the memory device 102).

The interface 200 includes a variety of wires that connect to ports of the memory device 102 and to testing and repair circuitry for the memory device 102. In this example, the testing and repair circuitry includes a BIST module 214, a BISR module 216, and an ECC module 218. Each of these modules is coupled to the memory device 102 and configured to implement their corresponding testing or repair functionality. The wires connected to the interface 200 include the following (each line illustrated in FIG. 2 may correspond to any number of physical wires carrying testing and repair signals).

bist_status: status signals from the BIST module 214 to the interface 200 indicating if BIST is running, and the result once BIST has completed.

bad_col: status signals from the BIST module 214 to the interface 200 indicating which column of the memory on which the BIST logic has detected a failure.

repair_in: signal from the interface 200 to the BISR module 216 for indicating a repair solution to multiplex out previously detected bad columns.

start_bist: control signal from the interface 200 to the BIST module 214 for indicating to the BIST module 214 to begin to run the BIST algorithm on the associated memory device 102.

bist_done: status signal from the BIST module 214 to the interface 200 indicating that the BIST algorithm has completed.

SBE: "single bit error" signal from the ECC module 218 to the interface 200 indicating the ECC logic has detected a single bit error in the data that was read from the memory device 102.

DBE: "double bit error" signal from the ECC module 218 to the interface 200 indicating the ECC logic has detected a double bit error in the data that was read from the memory device 102.

bad_address: signals from the ECC module 218 to the interface 200 indicating the address that the ECC logic has detected an error on most recently (qualified with SBE or DBE).

syndrome: signals from the ECC module in 218 to the interface 200 indicating the syndrome from ECC of the last ECC error detected (qualified with SBE or DBE).

correction_dis: signal from the interface 200 to the ECC module 218 for disabling automatic ECC correction of data read from the memory device 102.

flip_ecc: signals from the interface 200 to the ECC module 218 for causing the ECC logic to falsely detect a single or double bit error and report it through the normal path.

There are also wires between each memory and each of the BIST module 214, BISR module 216, and ECC module 218, including: ECC interrupt wires (SBE/DBE), BIST status wires, wires for control fields, ECC_disable wires, and wires for bits to force ECC errors. (These signals are not individually labeled in FIG. 2, for clarity of the illustration.)

There are also wires between the memory device 102 and the interface 200 of the SMC 112, including the following.

address: signal from the interface 200 to the memory device 102 providing an address of data to be read or written.

data_in: signal from the interface 200 to the memory device 102 providing data to be written at an address specified at the address port.

data_out: signal from the memory device 102 to the interface 200 providing data read from an address specified at the address port.

write_en/read_en: write and read enable signals from the interface 200 to the memory device 102 providing control signals to cause data on the data_in port to be written to the address specified on the address port to the memory or to be read from the memory and supplied on the data_out port.

Figure 3:
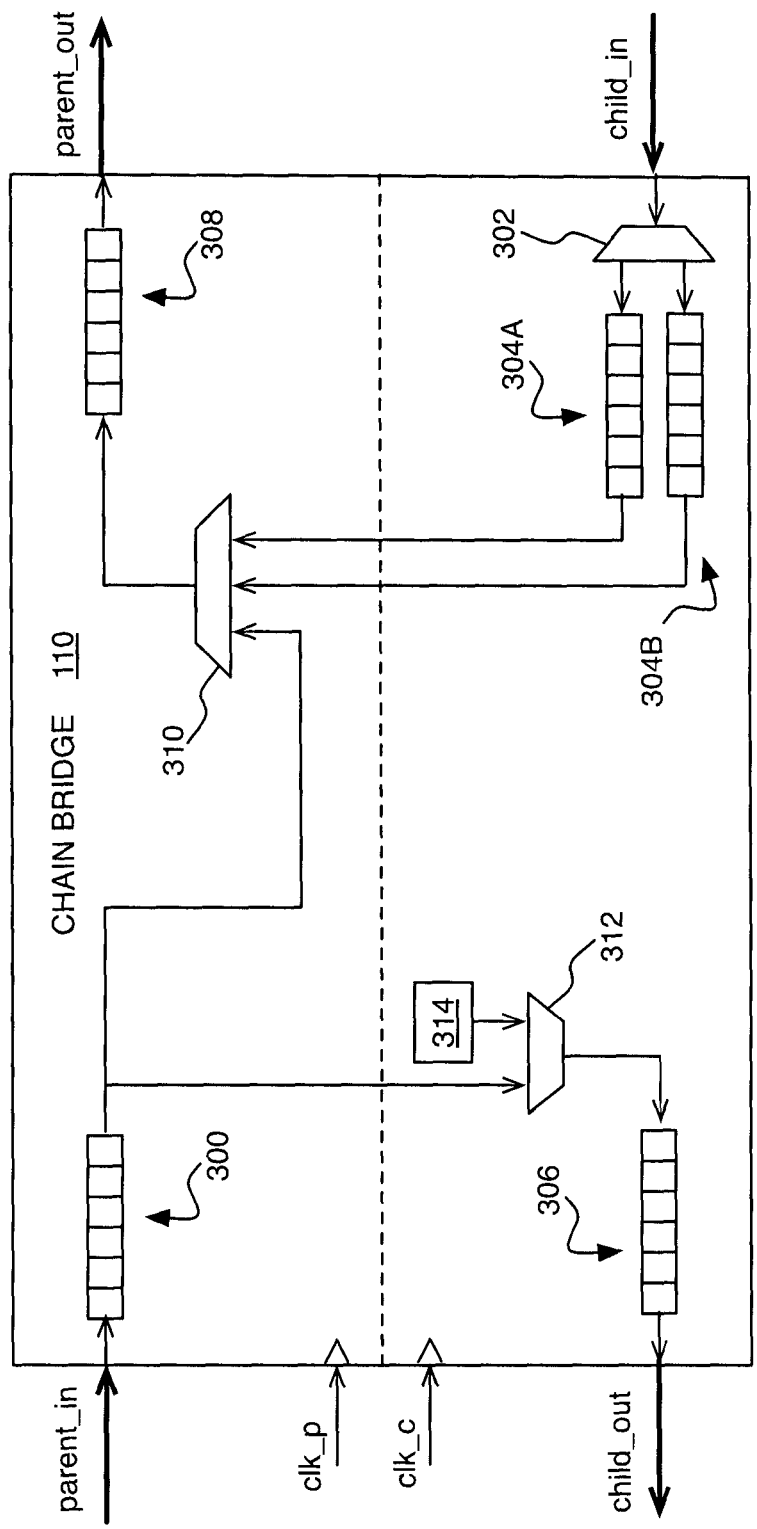
FIG. 3 is a schematic diagram of a chain bridge.

FIG. 3 shows an example of a chain bridge 110 that is configured to be able to couple a parent chain and a child chain, even if the parent chain and child chain are in different clock domains, such as for communication chains $C_{1B}$ and $C_2$ coupled by a chain bridge $CB_{12}$. A first set of chain input and output ports (parent_in, parent_out) couple the chain bridge 110 to a parent chain, and a second set of chain input and output ports (child_in, child_out) couple the chain bridge 110 to a child chain. For cases in which the parent and child chains are in different clock domains, there are separate clock ports clk_p and clk_c for the parent and child domains, respectively.

In this example, the chain bridge 110 includes a buffer 300 that stores data units received over the parent_in port. The chain bridge 110 also includes de-multiplexing circuitry 302, which determines the message type of data units received over the child_in input port, and sends the data units to the appropriate buffer 304A or 304B, according to the handling rules shown below. A buffer 306 stores data units to be transmitted out the child_out output port, and a buffer 308 stores data units to be transmitted out the patent_out output port. The chain bridge 110 also includes multiplexing circuitry 310 for selecting among the buffers 300, 304A, 304B according to the handling rules, and multiplexing circuitry 312 for selecting between buffer 300 and polling source 314, according to the handling rules and polling procedures. The buffers 300, 304A, 304B, 306, 308 may be shift registers, or FIFO buffers, for example.

The following table is an example of the handling rules for different message types. The rules are generally arranged so that data units from the MMC 104 are routed down all branches of the hierarchy to every SMC 112 and chain bridge 110, while response type data units from SMCs 112 are only routed up a particular branch of the hierarchy to the MMC 104.

| Message Type | If received on parent_in: | If received on child_in: |
|---|---|---|
| POLL | Forward to parent_out | Ignore |
| POLL_RSP | Forward to parent_out | Hold/Forward to parent_out |
| WRITE | Forward to parent_out and child_out | Ignore |
| READ | Forward to parent_out and child_out | Ignore |
| READ_RSP | Forward to parent_out | Forward to parent_out |
| ERR | Forward to parent_out | Forward to parent_out |
| SYNC/TEST | Forward to child_out | Forward to parent_out |
| RST | Forward to parent_out and child_out | Ignore |
| READ_MEM | Forward to parent_out and child_out | Forward to parent_out |
| READ_MEM_RSP | Forward to parent_out | Forward to parent_out |
| WRITE_MEM_ADDR | Forward to parent_out and child_out | Ignore |
| WRITE_MEM_DATA | Forward to parent_out and child_out | Ignore |

The multiplexing circuitry 310 and 312 will together select data units received at the parent_in input port in the buffer 304A for FIFO forwarding to the parent_out output port and/or the child_out output port, based on the decoded message type. The de-multiplexing circuitry 302 will filter out (or "Ignore") certain data units with a particular message type received over the child_in input port so that they are not forwarded to either the parent_out or the child_out output port (and therefore do not need to be stored in either buffer 304A or 304B). The de-multiplexing circuitry 302 will store certain data units received at the child_in input port in the buffer 304A for FIFO forwarding to the parent_out output port (i.e., "Forward to parent_out"). The de-multiplexing circuitry 302 will also store data units with a POLL_RSP message type in buffer 304B for temporary holding and later FIFO forwarding to the parent_out output port in response to a POLL data unit (i.e., Hold/Forward to parent_out).

Each chain bridge 110 is responsible for issuing POLL data units to its own child chain. Only one outstanding POLL data unit per chain bridge 110 is typically circulated at a time. The restrictions on the number of POLL data units that may be circulated include: (1) ensuring there are enough idle clock cycles after each POLL data unit for a POLL_RSP data unit, and (2) ensuring there is enough storage space in the buffer 304B for an additional POLL_RSP data unit to be stored. Also, the parent chain should be idle as well. The chain bridge 110 will push a POLL_RSP data unit being held at the head of its buffer 304B to the parent chain only in response to a POLL data unit received from the parent chain.

The rules allow for POLL_RSP data units to traverse up the hierarchy back to the MMC 104. A POLL data unit issued on the child chain of a chain bridge 110 (i.e., the chain controller of that child chain) will traverse the nodes on the child chain. If a node on the child chain (SMC 112 or chain bridge 110) has a response to the POLL data unit, and the next clock cycle is idle, it will assert the response on the chain immediately following the POLL data unit. Once the POLL data unit circulates around the child chain and makes it back to the chain bridge 110 acting as the chain controller, any POLL_RSP data unit following that POLL data unit is stored in the chain bridge 110. When the chain bridge 110 receives a POLL on the parent chain (i.e., the chain for which it is not acting as chain controller), and it has a stored POLL_RSP data unit, and the clock cycle after the POLL data unit is idle, it will transmit the POLL_RSP data unit to its neighboring node on the parent chain. Thus, by the MMC 104 continuing to issue POLL data units (e.g., whenever it is idle) it will enable POLL_RSP data units to propagate from the leaf chains of the hierarchy up to the root level chain, and to the MMC 104.

The MMC 104 can also be configured to perform memory mapping where the status information for each SMC 112 is mapped to a region (e.g., a Read-Only region) of an address space associated with the CPU interface 107 (i.e., memory addresses accessed by the CPU 106), and configuration and control information for each SMC 112 is mapped to another region (e.g., a Read-Write region) of the address space. For example, each memory 102 coupled to an SMC 112 may have ECC, BIST, BISR status and/or control fields that can be read and/or written. Write instructions arriving over the CPU interface 107 may be converted to WRITE data units, or WRITE_MEM_ADDR and WRITE_MEM_DATA data units. Read instructions arriving over the CPU interface 107 may be converted to READ or READ_MEM data units. The memory identifier values in the data units would be derived from the memory addresses in the instructions arriving over the CPU interface 107. In this manner, the MMC 104 is able to map each status/control field to the CPU's memory space, allowing simple access from the CPU to all of the fields used by an SMC 112 for managing its coupled memory 102.

The techniques described herein can be applied in any of a variety of contexts. For example, software running on a CPU that is part of a SoC is able to access and control configuration and fault status of embedded memory devices also integrated into the SoC (i.e., part of the same integrated circuit). The arrangement of the MMC, SMCs, and chain bridges within the hierarchical communication chain may be transparent to the software running on the CPU. Additionally, the SoC may include any of a variety of interrupt circuitry configured for interrupting software running on the CPU in the event of a fault in a memory. For example, a POLL_RSP can be converted into an interrupt signal that will be sent to the CPU. Additionally, the techniques described herein can be applied to testing and verification of a simulation of the SoC, at any of a variety of levels of representation, for simplifying the design and routing of an integrated circuit that uses embedded (i.e., "on-chip") memory devices, providing status and configuration information for each memory device. Additionally, while some examples above are described in the context of memory devices, the hierarchical communication chain can be used for testing and control of any of a variety of devices, including memory devices such as the embedded RAM devices discussed above or other types of memory devices, or different kinds of devices fabricated as part of the integrated circuit other than memory devices (e.g., input/output devices, or any device with messages to report to the CPU or other unit on the integrated circuit, such as interrupt messages).

Other embodiments are within the scope of the following claims.

What is claimed is:

1. An apparatus for testing devices coupled to respective slave controllers, the apparatus comprising:
   at least one master controller, the master controller including:
      an interface to a central processing unit,
      an input port configured to receive a digital signal from a conductor path coupled to that input port, and
      an output port configured to transmit a digital signal to a conductor path coupled to that output port;
   a plurality of slave controllers, each slave controller including:
      an interface to a device,
      an input port configured to receive a digital signal from a conductor path coupled to that input port, and
      an output port configured to transmit a digital signal to a conductor path coupled to that output port; and
   a first chain bridge that includes:
      a first set of input and output ports that couple the first chain bridge to a first closed-loop chain of nodes each coupled to its neighboring nodes, where the nodes of the first chain include the master controller, and
      a second set of input and output ports that couple the first chain bridge to a second closed-loop chain of nodes each coupled to its neighboring nodes, where the nodes of the second chain include at least two of the plurality of slave controllers.

2. The apparatus of claim 1, further comprising a hierarchy of chains that includes:
   the first chain at a root level of the hierarchy,
   the second chain at a first intermediate level below the root level, the nodes of the second chain including at least the first chain bridge coupling the second chain to the first chain, and a second chain bridge coupling the second chain to a third chain of nodes at a level below the first intermediate level, and
   at one or more levels of the hierarchy below the first intermediate level, multiple closed-loop chains of nodes each coupled to its neighboring nodes, where the nodes of each chain of the multiple chains include one or more slave controllers of the plurality of slave controllers and at least one chain bridge.

3. The apparatus of claim 2, wherein at least two different chains of nodes include slave controllers that include interfaces to devices in different clock domains of an integrated circuit.

4. The apparatus of claim 2, wherein at least two different chains of nodes include slave controllers that include interfaces to devices in different power domains of an integrated circuit.

5. The apparatus of claim 1, wherein each slave controller includes:
   a clock input port;
   circuitry that receives a digital signal over the input port according to edges of clock signal provided at the clock input port; and
   circuitry that transmits a digital signal over the output port according to edges of a clock signal provided at the clock input port.

6. The apparatus of claim 5, further comprising a first clock circuit providing a first clock signal to each slave controller in the second chain.

7. The apparatus of claim 6, further comprising a second clock circuit providing a second clock signal to each slave controller in a third chain of nodes, wherein the second clock signal has at least one of a different frequency or phase than the first clock signal.

8. The apparatus of claim 7, wherein a chain bridge coupled to both the second chain and the third chain includes circuitry that translates messages between digital signals with edges aligned to the first clock signal and digital signals with edges aligned to the second clock signal.

9. The apparatus of claim 1, wherein the master controller is configured to provide poll messages that circulate around the first chain, and the slave controllers are each configured to provide poll response messages that circulate around a chain whose nodes include that slave controller in response to a poll message after detecting an idle signal after the poll message.

10. The apparatus of claim 9, wherein the slave controllers are configured to circulate messages that correspond to status or control of a device coupled to its interface.

11. The apparatus of claim 10, wherein the master controller comprises a master memory controller, the slave controllers comprise slave memory controllers, and the devices comprise memory devices.

12. The apparatus of claim 11, wherein the messages include one or more of: a built-in self-test message, a built-in self-repair message, or an error-correcting code message.

13. A non-transitory machine-readable medium storing a program for testing devices coupled to respective slave controllers, the program including instructions for causing a machine to:
- simulate at least one master controller, the master controller including:
  - an interface to a central processing unit,
  - an input port configured to receive a digital signal from a conductor path coupled to that input port, and
  - an output port configured to transmit a digital signal to a conductor path coupled to that output port;
- simulate a plurality of slave controllers, each slave controller including:
  - an interface to a device,
  - an input port configured to receive a digital signal from a conductor path coupled to that input port, and
  - an output port configured to transmit a digital signal to a conductor path coupled to that output port; and
- simulate a first chain bridge that includes:
  - a first set of input and output ports that couple the first chain bridge to a first closed-loop chain of nodes each coupled to its neighboring nodes, where the nodes of the first chain include the master controller, and
  - a second set of input and output ports that couple the first chain bridge to a second closed-loop chain of nodes each coupled to its neighboring nodes, where the nodes of the second chain include at least two of the plurality of slave controllers.

14. The medium of claim 13, further comprising instructions for causing the machine to simulate a hierarchy of chains that includes:
- the first chain at a root level of the hierarchy,
- the second chain at a first intermediate level below the root level, the nodes of the second chain including at least the first chain bridge coupling the second chain to the first chain, and a second chain bridge coupling the second chain to a third chain of nodes at a level below the first intermediate level, and
- at one or more levels of the hierarchy below the first intermediate level, multiple closed-loop chains of nodes each coupled to its neighboring nodes, where the nodes of each chain of the multiple chains include one or more slave controllers of the plurality of slave controllers and at least one chain bridge.

15. The medium of claim 14, wherein at least two different chains of nodes include slave controllers that include interfaces to devices in different clock domains of an integrated circuit.

16. The medium of claim 14, wherein at least two different chains of nodes include slave controllers that include interfaces to devices in different power domains of an integrated circuit.

17. The medium of claim 13, wherein each slave controller includes:
- a clock input port;
- circuitry that receives a digital signal over the input port according to edges of clock signal provided at the clock input port; and
- circuitry that transmits a digital signal over the output port according to edges of a clock signal provided at the clock input port.

18. The medium of claim 17, further comprising instructions for causing the machine to simulate a first clock circuit providing a first clock signal to each slave controller in the second chain.

19. The medium of claim 18, further comprising instructions for causing the machine to simulate a second clock circuit providing a second clock signal to each slave controller in a third chain of nodes, wherein the second clock signal has at least one of a different frequency or phase than the first clock signal.

20. The medium of claim 19, wherein a chain bridge coupled to both the second chain and the third chain includes circuitry that translates messages between digital signals with edges aligned to the first clock signal and digital signals with edges aligned to the second clock signal.

21. The medium of claim 13, wherein the master controller is configured to provide poll messages that circulate around the first chain, and the slave controllers are each configured to provide poll response messages that circulate around a chain whose nodes include that slave controller in response to a poll message after detecting an idle signal after the poll message.

22. The medium of claim 21, wherein the slave controllers are configured to circulate messages that correspond to status or control of a device coupled to its interface.

23. The medium of claim 22, wherein the master controller comprises a master memory controller, the slave controllers comprise slave memory controllers, and the devices comprise memory devices.

24. The medium of claim 23, wherein the messages include one or more of: a built-in self-test message, a built-in self-repair message, or an error-correcting code message.

25. A method for testing design or fabrication of an integrated circuit that includes slave controllers for coupling to respective devices, the method comprising:
- executing instructions corresponding to at least one master controller, the master controller including:
  - an interface to a central processing unit,
  - an input port configured to receive a digital signal from a conductor path coupled to that input port, and
  - an output port configured to transmit a digital signal to a conductor path coupled to that output port;
- executing instructions corresponding to a plurality of slave controllers, each slave controller including:
  - an interface to a device,
  - an input port configured to receive a digital signal from a conductor path coupled to that input port, and
  - an output port configured to transmit a digital signal to a conductor path coupled to that output port; and
- executing instructions corresponding to a first chain bridge that includes:
  - a first set of input and output ports that couple the first chain bridge to a first closed-loop chain of nodes each coupled to its neighboring nodes, where the nodes of the first chain include the master controller, and
  - a second set of input and output ports that couple the first chain bridge to a second closed-loop chain of nodes each coupled to its neighboring nodes, where the nodes of the second chain include at least two of the plurality of slave controllers.

26. The method of claim 25, further comprising executing instructions corresponding to a hierarchy of chains that includes:
- the first chain at a root level of the hierarchy,
- the second chain at a first intermediate level below the root level, the nodes of the second chain including at least the first chain bridge coupling the second chain to the first chain, and a second chain bridge coupling the second chain to a third chain of nodes at a level below the first intermediate level, and at one or more levels of the hierarchy below the first intermediate level, multiple closed-loop chains of nodes each coupled to its neighboring nodes, where the nodes of each chain of the multiple chains include one or more slave controllers of the plurality of slave controllers and at least one chain bridge.

27. The method of claim 26, wherein at least two different chains of nodes include slave controllers that include interfaces to devices in different clock domains of an integrated circuit.

28. The method of claim 26, wherein at least two different chains of nodes include slave controllers that include interfaces to devices in different power domains of an integrated circuit.

29. The method of claim 25, wherein each slave controller includes:
   a clock input port;
   circuitry that receives a digital signal over the input port according to edges of clock signal provided at the clock input port; and
   circuitry that transmits a digital signal over the output port according to edges of a clock signal provided at the clock input port.

30. The method of claim 29, further comprising executing instructions corresponding to a first clock circuit providing a first clock signal to each slave controller in the second chain.

31. The method of claim 30, further comprising executing instructions corresponding to a second clock circuit providing a second clock signal to each slave controller in a third chain of nodes, wherein the second clock signal has at least one of a different frequency or phase than the first clock signal.

32. The method of claim 31, wherein a chain bridge coupled to both the second chain and the third chain includes circuitry that translates messages between digital signals with edges aligned to the first clock signal and digital signals with edges aligned to the second clock signal.

33. The method of claim 25, wherein the master controller is configured to provide poll messages that circulate around the first chain, and the slave controllers are each configured to provide poll response messages that circulate around a chain whose nodes include that slave controller in response to a poll message after detecting an idle signal after the poll message.

34. The method of claim 33, wherein the slave controllers are configured to circulate messages around a chain that correspond to status or control of a device coupled to its interface.

35. The method of claim 34, wherein the master controller comprises a master memory controller, the slave controllers comprise slave memory controllers, and the devices comprise memory devices.

36. The method of claim 35, wherein the messages include one or more of: a built-in self-test message, a built-in self-repair message, or an error-correcting code message.

* * * * *